(12) United States Patent
Byun

(10) Patent No.: US 6,518,149 B1
(45) Date of Patent: Feb. 11, 2003

(54) SEMICONDUCTOR DEVICE AND METHOD OF MANUFACTURING THE SAME

(75) Inventor: Hyun-Og Byun, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/657,185

(22) Filed: Sep. 7, 2000

(30) Foreign Application Priority Data

Sep. 10, 1999 (KR) ............................................. 99-38752

(51) Int. Cl.⁷ ............................................. H01L 21/425
(52) U.S. Cl. ....................................... 438/526; 438/527
(58) Field of Search ................................. 438/199–233, 438/217, 275, 276, 289–291, 526, 527, 529, 514

(56) References Cited

U.S. PATENT DOCUMENTS

| | | | |
|---|---|---|---|
| 5,468,983 A | * 11/1995 | Hirase et al. | ................ 257/344 |
| 5,576,226 A | 11/1996 | Hwang | |
| 5,780,310 A | 7/1998 | Koyama | |
| 6,043,537 A | * 3/2000 | Jun et al. | ..................... 257/350 |
| 6,104,059 A | * 8/2000 | Ono | ............................. 257/314 |
| 6,121,086 A | * 9/2000 | Kuroda et al. | ............... 438/238 |
| 6,159,799 A | * 12/2000 | Yu | ............................... 438/211 |

* cited by examiner

*Primary Examiner*—David Nelms
*Assistant Examiner*—David Vu

(57) ABSTRACT

A first mask which is formed which exposes a cell array region and a peripheral circuit region of a semiconductor substrate. The cell array region and the peripheral circuit region are of a same conductive MOS type. Then, a preceding ion implantation process is implemented in both the cell array region and the peripheral circuit region utilizing the first mask. The preceding ion implantation process has ion implantation parameters corresponding to first implantation design specifications of one of the cell array region and the peripheral circuit region. Then, a second mask is formed which shields the one of the cell array region and the peripheral circuit region and which exposes the other of the cell array region and the peripheral circuit region. A subsequent ion implantation process is then implemented in the other of the cell array region and the peripheral circuit region utilizing the second mask. The subsequent ion implantation process has ion implantation parameters which compensate for a difference between the ion implantation parameters of the preceding implantation process and second implantation design specifications of the other of the cell array region and the peripheral circuit region.

21 Claims, 7 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and to a method of manufacturing the same, and more particularly, the present invention relates to a semiconductor device having improved properties and to a method of manufacturing the same in which a number of process steps is reduced by controlling ion implantation process parameters in a peripheral circuit region and a cell array region.

2. Description of the Related Art

Recently, as the use of computers in information media is expanding, rapid developments in semiconductor memory devices have also taken place. That is, highly integrated devices having improved reliability and response times have been developed, resulting in semiconductor memories with high operational speeds and large storage capacities.

Highly integrated semiconductor devices are obtained by precise electrical isolation of various elements such as transistors, diodes, resistors, and the like formed on a semiconductor substrate. Isolation parameters are adopted at an early stage of the manufacturing process and define the size of an active region and process margins of subsequent processes.

Generally, the degree of integration of semiconductor devices has exhibited a fourfold increase every three years, while the physical area of the devices has only increased 1.4 times over that same period. Thus, the pitch size between elements has been reduced. As the pitch size between elements continues to be reduced, it becomes difficult to manufacture a device having satisfactory dielectric and refresh characteristics. The process of isolating an appropriately sized portion within a limited cell array region is one of the most difficult tasks associated with achieving highly integrated semiconductor devices.

Currently, an isolation method utilizing poly spacer local oxidation is widely used for the manufacture of active patterns having small pitch sizes. However, the resulting profile becomes distorted due to the formation of a bird's beak at the side portion of the field oxide. This results in deterioration of the refresh characteristic.

To improve upon drawbacks associated with this problem, an ammonia ($NH_3$) plasma process is utilized to increase the effective channel length and to compensate for the thickness of the field oxides. In this method, the growth of the bird's beak by an oxidation of the side portion of the field oxide can be restrained through nitrification of the surface portion of the field oxide by the ammonia plasma.

The nitrification reduces the oxidation of the side portion of the field oxides, thereby increasing their thicknesses. In particular, the thickness of the field oxides can be increased by about 200 Å using the ammonia plasma treatment and this increases the effective field length to about 150 Å. As such, this method advantageously results in increased process margins. However, the manufacturing process as a whole, becomes more complicated.

In another method of increasing isolation, a channel stopping ion implantation is implemented under the active region. The ion implantation is carried out by applying high energy to ions and injecting the ions to penetrate the surface of a solid to be injected. Through the ion implantation, the number of impure elements and the junction depth of the active region can be correctly controlled. In addition, since the processing temperature is low, a photoresist layer can be utilized as a protection layer and the concentration of the injected impurity is almost uniform from the surface of a wafer. Further, the lateral spread of the impurity with respect to the vertical plane of the wafer surface is even less than that obtained by thermal spread.

For the silicon wafer, trivalent boron(B), pentavalent phosphor(P), arsenic(As) and the like can be utilized as the impurities. Since these elements do not have gaseous phases at ambient temperature, gaseous molecules including these impurities are utilized. $BF_3$, $BCl_3$, and the like can be exemplified as the molecules including boron, $PH_3$ can be utilized as the molecules including phosphor, and $AsH_3$ can be utilized as the molecules including arsenic. The ion implanting process will be schematically explained for implanting boron ions by utilizing $BF_3$ gas.

First, $BF_3$ gas molecules are introduced into a gas room so that the molecules and thermal electrons emitted from a heated filament collide. At this time, the thermions are accelerated by applying a voltage difference of about 100V to increase an ionization degree of the $BF_3$ gas molecules and a magnetic field is applied to increase the collision probability. From the collision of the emitted thermions and the $BF_3$ molecules, dissociated ions such as $_{10}B^+$, $F_2^+$, $_{11}BF^+$, $_{11}B^+$, and the like are produced and desired $_{11}B^+$ ions are selected and accelerated by an appropriate magnetic field in a sorter. (The numbers preceding the letter B designate atomic weights of boron.)

After extracting the desired ions at the plasma state, a high energy is applied to accelerate the ions so that the ions impact the surface of the wafer, and the thus accelerated ions are injected into the wafer. At this time, the applied energy determines the junction depth. In order to control the concentration of the impurity, the amount of ions per unit area ($atoms/cm^2$), that is, dose is controlled. The ion implanted depth is controlled by the acceleration energy (eV) of the injected ions.

One important defect in the ion implanting process is a damage imparted on the crystal lattice of a single crystal silicon wafer after the collision of the ions of high energy onto the wafer. To recover the damage and to activate the injected impurities, an annealing at about 900–1000° C. is implemented after the completion of the ion implantation process. Further, drawbacks in applying a high voltage and an introduction of poisonous gases accompany the ion implantation process. Nevertheless, the ion implantation process is commonly utilized for the formation of a P-well and N-well, for the control of a threshold voltage, and for the formation of a source/drain region.

The ion implantation process is utilized to overcome the problems caused by different processing parameters for forming a cell array region and a peripheral circuit region. For example, U.S. Pat. No. 5,576,226 (issued to Hwang) discloses a method for controlling the thickness of a gate oxide layer by selectively injecting oxidation promoting ions or oxidation retarding ions into a cell array region and a peripheral circuit region. In addition, U.S. Pat. No. 5,780,310 (issued to Koyama) discloses a method for forming a cell array region on a recess having a first impurity concentration and a peripheral circuit region having a second impurity concentration so that the cell array region is formed from a lower portion than the peripheral circuit region.

Commonly, the channel stopping ion implantation is carried out after forming the N-well/P-well and $Si_3N_4/SiO_2$ pattern. Through utilizing the $Si_3N_4/SiO_2$ pattern, $B^+$ ions are injected for the P-well and P+ ions are injected for the N-well. This channel stopping ion implantation also is referred to as a field ion implantation.

Practically, the field ion implantation is separately implemented for the cell array region and the peripheral circuit region by utilizing different masks even for the same conductive type MOS regions such as NMOS or PMOS regions. The two regions have different ion implanting parameters because the thickness of a field oxide at the cell array region is about 1500 Å and that of the peripheral circuit region is about 2000 Å. Although the formation of the field oxides is carried out simultaneously for the two regions, the thicknesses of the field oxides at the two regions become different because the critical dimension at the cell array region is narrower than that at the peripheral circuit region.

Similarly, the field ion implantation processes at the NMOS cell array region and the NMOS peripheral circuit region are carried out by utilizing different photo masks. Accordingly, when a photoresist pattern is formed by utilizing a photo mask, all the ion implantation processes applicable to an exposed region, such as an ion implantation for the formation of a well, a field ion implantation, and an ion implantation for controlling a threshold voltage are continuously carried out. Then, another photoresist pattern is formed by utilizing another photo mask to continuously implement corresponding ion implantation processes for an exposed region.

Hereinafter, an ion implantation method for a device having an NMOS cell array region and a CMOS peripheral circuit region will be explained in detail.

FIGS. 1A to 1C illustrate a conventional ion implantation method for a device having an NMOS cell array region CN and a first and a second peripheral circuit regions PN-1 and PN-2 of a CMOS type.

Referring to FIG. 1A, a photoresist pattern 11 for shielding NMOS type cell array region CN and PMOS type second peripheral circuit region PN-2 and for exposing NMOS type first peripheral circuit region PN-1 is formed on a substrate 10. An ion implantation for the formation of a P-well, field ion implantation, and an ion implantation for controlling a threshold voltage for first peripheral circuit region PN-1 are continuously implemented.

Referring to FIG. 1B, a photoresist pattern 12 for shielding cell array region CN and first peripheral circuit region PN-1 and for exposing second peripheral circuit region PN-2 is formed. An ion implantation for the formation of an N-well, field ion implantation, and an ion implantation for controlling a threshold voltage for second peripheral circuit region PN-2 are continuously implemented.

Referring to FIG. 1C, a photoresist pattern 13 for shielding first and second peripheral circuit regions PN-1 and PN-2 and for exposing cell array region CN is formed. An ion implantation for a formation of a P-well, field ion implantation, and an ion implantation for controlling a threshold voltage for cell array region CN are continuously implemented.

As shown in the figures, the ion implantation processes for first peripheral circuit region PN-1 and cell array region CN are separately implemented even though they are the same NMOS type. The kind of ions, applied energy, and dose for each ion implantation process will be exemplified for first peripheral circuit region PN-1 and cell array region CN. The explanation on second peripheral circuit region PN-2 of the PMOS type will be omitted.

For the first peripheral circuit region PN-1, the ion implanting parameters for formation of the P-well are $_{11}B^+$, 500 KeV, $1.0 \times 10^{13}$; the ion implanting parameters for formation of the field ion implantation are $_{11}B^+$, 120 KeV, $9.0 \times 10^{12}$; and the ion implanting parameters for control of the threshold voltage are $_{11}B^+$, 50 KeV, $1.0 \times 10^{12}$. Likewise, for the cell array region CN, the ion implanting parameters for the formation of the P-well is $_{11}B^+$, 500 KeV, $1.0 \times 10^{13}$; the ion implanting parameters for formation of the field ion implantation are $_{11}B^+$, 100 KeV, $7.5 \times 10^{12}$; and the ion implanting parameters for control of the threshold voltage are $_{49}BF_2^+$, 50 KeV, $6.2 \times 10^{12}$. (The numeral 11 of $_{11}B^+$ indicates the atomic weight of boron and the numeral 49 of $_{49}BF_2^+$ indicates the molecular weight of $BF_2^+$.) The differences in the field ion implanting parameters are attributed to the difference in thicknesses of the field oxides at the two regions. That is, since the field oxide at the peripheral circuit region is thicker than that at the cell array region, the parameters applied for the peripheral region is stronger.

In conclusion, even though the parameters for the formation of the wells are the same for the two regions, the ion implantation processes are separately implemented because the parameters for the subsequent ion implantation processes are different. In the above-described conventional method, a large number of process steps are required for the manufacture of the semiconductor devices. Thus, the manufacturing process is complicated and the productivity (production rate) of the device is very low.

SUMMARY OF THE INVENTION

Accordingly, it is an object of the present invention to provide an advantageous method for manufacturing a semiconductor device which has reduced processing steps and an improved productivity.

It is a further object in the present invention to provide a semiconductor device having improved properties which can be manufactured by such an advantageous method.

According to one aspect of the present invention, a semiconductor device is provided which includes a cell array region and a peripheral circuit region. The cell array region and the peripheral circuit region have corresponding ion implanted regions of a same object and a same conductive MOS type. Further, the cell array region includes a first ion implanted region which has a same depth and dose as an ion implanted region formed on the peripheral circuit region, and a second ion implanted compensation region. The ion implanted region can be formed by field ion implantation process or ion implantation process for controlling a threshold voltage. The second ion implanted compensation region can be formed above the first ion implanted region from a bottom portion of a substrate or a depth of the second ion implanted compensation region can be the same as a depth of the first ion implanted region.

According to another aspect of the present invention, a method of manufacturing a semiconductor device is provided which includes forming a first mask which exposes a cell array region and a peripheral circuit region of a semiconductor substrate. The cell array region and the peripheral circuit region having a same conductive MOS type. Then, a preceding ion implantation process is implemented in both the cell array region and the peripheral circuit region utilizing the first mask. The preceding ion implantation process has ion implantation parameters corresponding to first implantation design specifications of one of the cell array region and the peripheral circuit region. Then, a second mask is formed which shields the one of the cell array region and the peripheral circuit region and which exposes the other of the cell array region and the peripheral circuit region.

Then, a subsequent ion implantation process is implemented in the other of the cell array region and the peripheral circuit region utilizing the second mask. The subsequent ion implantation process has ion implantation parameters which compensate for a difference between the ion implantation parameters of the preceding implantation process and second implantation design specifications of the other of the cell array region and the peripheral circuit region.

According to still another aspect of the present invention, a method of manufacturing a semiconductor device is provided with includes forming a first mask which exposes a cell array region and a peripheral circuit region of a semiconductor substrate, the cell array region and the peripheral circuit region each being of a same conductive MOS type. Then, a first ion implantation for forming a well, a second ion implantation for forming a field, and a third ion implantation for controlling a threshold voltage are conducted in both the cell array region and the peripheral circuit region utilizing the first mask. Ion implantation parameters of the first, second and third ion implantations correspond to implantation design specifications of the peripheral circuit region and include an implantation angle of about 7° from normal. Then, a second mask is formed which shields the peripheral circuit region and which exposes the cell array region. Then, a fourth ion implantation for forming a field and a fifth ion implantation for controlling a threshold voltage are conducted in the cell array region utilizing the second mask. Ion implantation parameters of the fourth and fifth ion implantations compensate for a difference between the ion implantation parameters of the second and third implantation processes and implantation design specifications of the cell array region and include an implantation angle of about 0° from normal.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

Hereinafter, embodiments of the present invention will be explained in more detail with reference to the accompanying drawings. However, it should be understood that the present invention is not limited to the following embodiments.

Figure 2A:
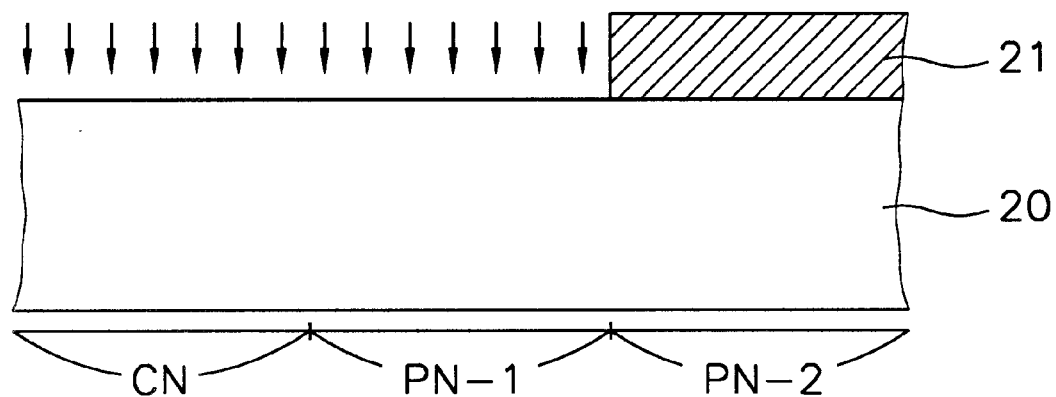
FIGS. 2A to 2C illustrate a method for implanting ions onto a cell array region and a peripheral circuit region according to an embodiment of the present invention.
Figure 2B:
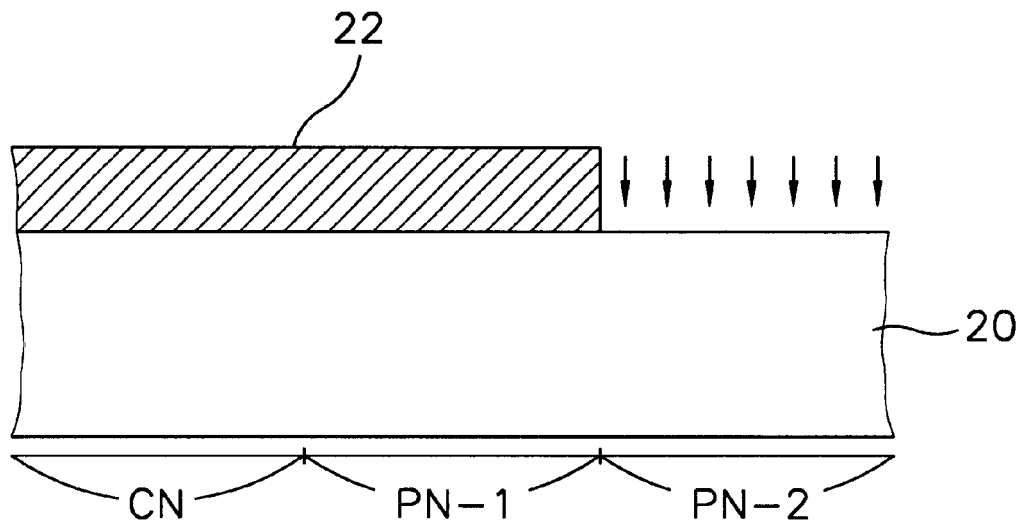
Figure 2C:
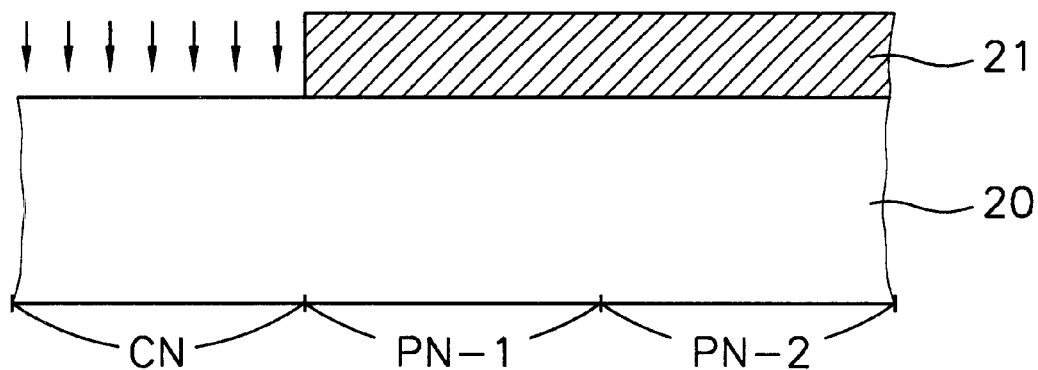

FIGS. 2A to 2C illustrate a method of implanting ions onto an NMOS type cell array region CN, an NMOS type first peripheral circuit region PN-1, and a PMOS type second peripheral circuit region PN-2, according to an embodiment of the present invention.

Referring to FIG. 2A, a photoresist pattern 21 is formed on a substrate 20 so as to expose cell array region CN and first peripheral circuit region PN-1 and so as to shield second peripheral circuit region PN-2. Then, ion implantation processes are implemented having parameters which are appropriate for first peripheral circuit region PN-1. In this embodiment, an ion implantation for forming a P-well, a field ion implantation and an ion implantation for controlling a threshold voltage are implemented.

Referring to FIG. 2B, a photoresist pattern 22 is formed so as to expose second peripheral circuit region PN-2 and so as to shield cell array region CN and first peripheral circuit region PN-2. Then, an ion implantation is implemented having parameters which are appropriate for the second peripheral circuit region PN-2. In this embodiment, an ion implantation for forming a P-well, a field ion implantation and an ion implantation for controlling a threshold voltage are implemented.

Referring to FIG. 2C, a photoresist pattern 23 is formed so as to expose cell array region CN and so as to shield first and second peripheral circuit regions PN-1 and PN-2. Then, subsequent ion implantation processes are implemented to effect compensation. That is, as noted above in connection with FIG. 2A, ions have been implanted onto cell array region CN using implantation parameters which are appropriate for the first peripheral circuit region PN-1. Thus, in the cell array region CN, it is necessary to compensate for the resultant difference from desired implantation characteristics obtained by the preceding implantation processes. However, the ion implantation parameters for the formation of wells are the same for both the cell array region CN and first peripheral circuit region PN-1. Therefore, it is not necessary to compensate for the well formation in the cell array region CN, and instead compensation for the field ion implantation and the ion implantation for controlling the threshold voltage is all this is needed.

Figure 1A:
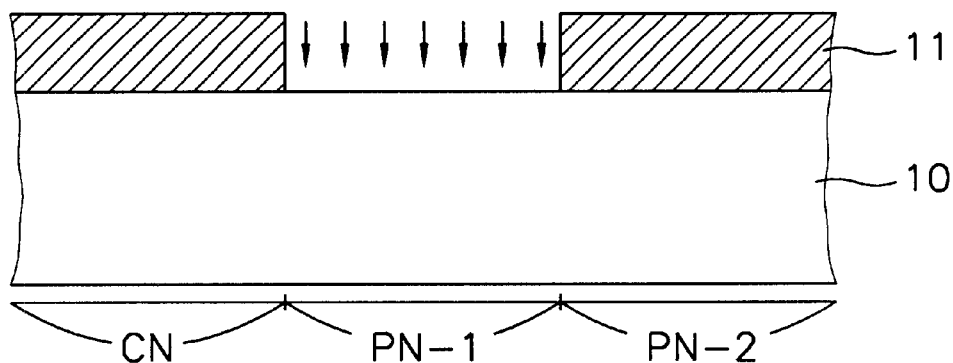
FIGS. 1A to 1C illustrate a method for implanting ions onto a cell array region and a peripheral circuit region according to the conventional method.
Figure 1B:
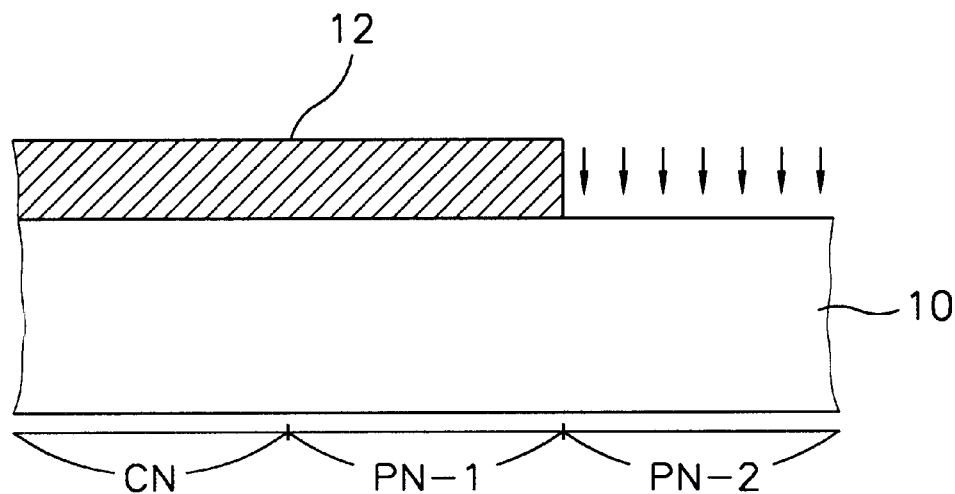
Figure 1C:
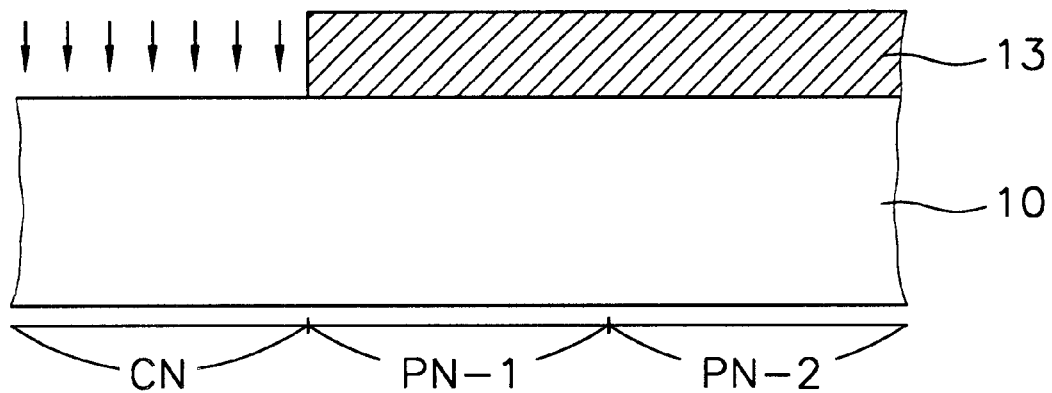

In comparing the present invention with the convention method of FIGS. 1A to 1C, the number of the utilized masks is the same. However, as explained above, the P-well formation process in the cell array region can be omitted in the present invention, thus reducing the number of implantation processing steps. In addition, the ion implanting parameters for the subsequent compensation processes are moderated.

Figure 3:
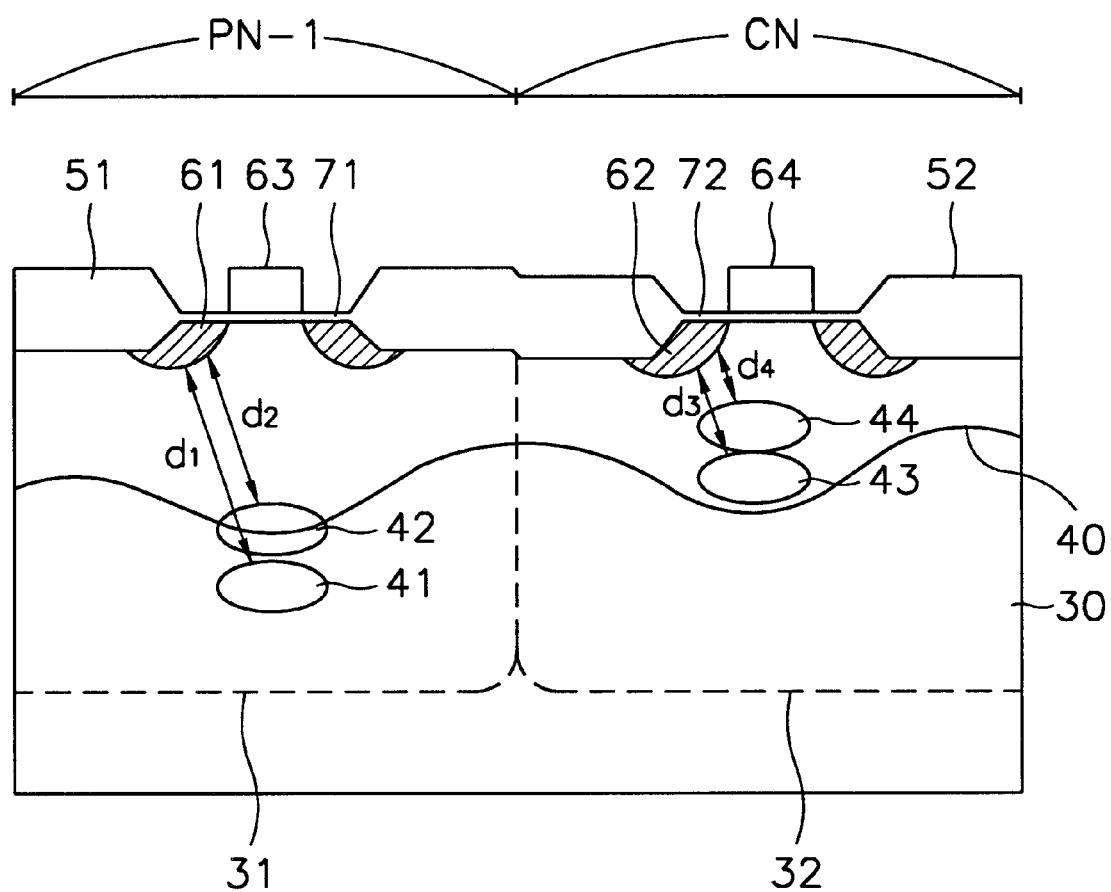
FIG. 3 is a cross-sectional view of a semiconductor device for illustrating a relation between an applied energy and a depth of an ion implanted region according to the present invention.

FIG. 3 is a cross-sectional view of a semiconductor device which illustrates a relationship between an applied energy and a depth of an ion implanted region. In the example of FIG. 3, only cell array region CN and the peripheral circuit region PN-1 of the same NMOS type are shown, since the ion implantation of the PMOS type region PN-2 is the same as that of the conventional method. Also, an explanation in which the cell array region and one of peripheral circuit regions are both PMOS type regions is omitted below, since the described method applied to the same NMOS type regions can be also applied to the same PMOS type regions.

In FIG. 3, a device is separated into an NMOS type peripheral region PN-1 and an NMOS type cell array region CN. Peripheral circuit region PN-1 and cell array region CN respectively include first and second P-wells 31 and 32, and first and second field oxides 51 and 52. The thickness of field oxide 51 formed at peripheral circuit region PN-1 is about 2000 Å and that of field oxide 52 at cell array region CN is about 1500 Å. First and second gate oxides 71 and 72 of about 100 Å, first and second gate electrodes 63 and 64 and first and second impurity doped regions 61 and 62 are formed between each field oxide 51 and 52.

By implementing a field ion implantation process, $B^+$ ions, for example, are implanted into a region around an ion implanted line 40 as illustrated in FIG. 3. This ion implantation increases the isolation efficiency between elements. Appropriate ion implantation parameters for each process is as follows. First, ion implantation parameters for the formation of P-wells on the cell array region and the peripheral circuit region are the same, i.e., $_{11}B^+$, 500 KeV, $1.0 \times 10^{13}$. Therefore, if an ion implantation for the formation of the P-well on the peripheral circuit region PN-1 is carried out utilizing the mask illustrated in FIG. 2A, a desired P-well is also obtained in the cell array region CN.

On the other hand, the parameters of the field ion implantation for the peripheral circuit region are $_{11}B^+$, 120 KeV, $7.2 \times 10^{12}$ and those for the cell array region are $_{11}B^+$, 100 KeV, $7.5 \times 10^{12}$. In this invention, the field ion implantation is implemented utilizing the mask illustrated in FIG. 2A with parameters appropriate for the peripheral circuit region. In the present embodiment, however, these parameters are $_{11}B^+$, 110 KeV, $7.2 \times 10^{12}$. When compared with the normal implantation parameters of the peripheral circuit region, the energy value is lowered in this embodiment from 120 KeV to 110 KeV. This will decrease the energy difference of the normal energy value of 100 KeV for the cell array region. Repeated experiments by the inventor demonstrate that this lower value does not affect the isolation characteristic for the peripheral circuit region. The field ion implantation for the cell array region is compensated by utilizing the mask illustrated in FIG. 2C with the implantation parameters of $_{11}B^+$, 90 KeV, $1.5 \times 10^{12}$.

The implantation parameters for controlling the threshold voltage are $_{11}B^+$, 50 KeV, $1.0 \times 10^{12}$ for the peripheral circuit region and are $_{49}BF_2^+$, 50 KeV, $6.2 \times 10^{12}$ for the cell array region. First, an ion implantation with the parameters of $_{11}B^+$, 50 KeV, $1.0 \times 10^{12}$ is implemented for the two regions by utilizing the mask illustrated in FIG. 2A. Then, the compensating ion implantation for the cell array region is implemented with the parameters of $_{49}BF_2^+$, 50 KeV, $6.0 \times 10^{12}$ by utilizing the mask illustrated in FIG. 2C. The energy values required for the two regions are the same and the applied dose is reduced a little for the compensation process.

In summary, an ion implantation process for the formation of a well on the peripheral circuit region (and the cell array region), a field ion implantation of the peripheral circuit region, an ion implantation process for the control of the threshold voltage for the peripheral circuit region, a compensating field ion implantation for the cell array region and a compensating ion implantation process for the control of the threshold voltage are sequentially implemented.

When compared with the conventional method, a separate ion implantation process for the formation of the P-well in the cell array region is omitted in the present invention. In addition, subsequently implemented compensating processes of the field ion implantation and threshold voltage control are carried out with new implantation parameters. The new parameters for the compensation processes are determined as described below.

First, the parameters of the field ion implantation for the peripheral circuit region are $_{11}B^+$, 120 KeV, $9.0 \times 10^{12}$ when implementing the conventional method as illustrated in FIG. 1A. On the other hand, these parameters are $_{11}B^+$, 110 KeV, $7.2 \times 10^{12}$ when implementing the method of the present invention as illustrated in FIG. 2A, to obtain corresponding ion implanted line 40. That is, the energy value and the dose are reduced in the present invention. This values are obtained by optimizing the field ion implantation parameters on the cell array region. An imaginary second ion implanted region 42 is limited around ion implanted line 40 and second ion implanted region 42 is compared with a first ion implanted region 41 which is formed by applying a lower energy than that applied for the second ion implanted region 42 and with a third ion implanted region 43 which is formed by applying a higher energy than that for region 42.

A distance $d_1$, from first region 41 to an impurity doped region, for example, a source region 61, is determined by the value of the applied energy. An appropriate dose corresponding to that distance is determined. If the applied energy decreases and ions are implanted onto second region 42, a distance $d_2$ from second region 42 to source region 61 is obtained. Since distance $d_2$ is shorter than distance $d_1$, a refresh characteristic of a device having second region 42 becomes inferior to a device having first region 41.

In the meantime, when a dose amount increases, a dielectric effect increases while the refresh characteristic decreases. Accordingly, when the distance from the ion implanted region to the source region becomes shorter, the dose amount should be decreased, and when the distance becomes longer, the dose amount should be increased to obtain an appropriate dielectric and refresh effect.

In FIG. 1A, the ion implantation is carried out by applying an energy of 120 KeV with a dose of $9.0 \times 10^{12}$. In FIG. 2A, since an energy of 110 KeV is smaller than that applied in FIG. 1A, the dose is decreased to $7.2 \times 10^{12}$ to obtain a similar dielectric and refresh characteristic with those obtained by implementing the ion implantation by applying an energy of 120 KeV and dose of $9.0 \times 10^{12}$.

Next, the compensating parameters of the field ion implantation for the cell array region will be explained. Conventionally, the parameters of the field ion implantation for the cell array region are $_{11}B^+$, 100 KeV, $7.5 \times 10^{12}$. When compared with the conventional parameters, the parameters of the present embodiment of $_{11}B^+$, 110 KeV, $7.2 \times 10^{12}$ which are appropriate for the peripheral circuit region and are implemented by utilizing the mask illustrated in FIG. 2A, the energy is increased while the dose is decreased. That is, an appropriate and conventional ion implanted region is third ion implanted region 43 and a distance from third region 43 to source region 61 is $d_3$. Practically, however, ion implanted region is second region 42 around ion implanted line 40. Accordingly, an actual ion implanted region is deeper than the desired region.

To obtain an appropriate dielectric and refresh characteristic, ions are implanted onto a fourth ion implanted region 44 which is shallower than the desired third region 43, thereby achieving compensation. The resulting dielectric and refresh effect obtained by implanting ions onto second and fourth regions 42 and 44 will give the same effect obtained by implanting ions onto third region 43. Since a distance $d_4$ from fourth region 44 to source region 61 is very short, the dose amount is determined so as to be smaller than that corresponding to third region 43.

As a result of repeated experiments, the present inventor found that the preferred energy value applied for the subsequent field ion implantation process is about 0.7–1 times (preferably about 0.85–1 times) the energy value required for the cell array or peripheral circuit regions where the subsequent field ion implantation process is implemented when the ion implantation processes for the cell array and peripheral circuit regions are separately implemented.

Further, a sum of doses applied for the preceding and subsequent field ion implantation processes is about 1–1.3 times of a dose required for the cell array or peripheral circuit regions where the subsequent field ion implantation process is implemented when the ion implantation processes for the cell array and peripheral circuit regions are separately implemented. In the preferred embodiment of the present invention, the energy value of 90 KeV and the dose amount of $1.5 \times 10^{12}$ was applied.

For the ion implantation for controlling the threshold voltage, the compensating parameters can be determined in a similar manner as described for the field ion implantation. The conventionally applied parameters for the peripheral circuit region are $_{11}B^+$, 50 KeV, $1.0 \times 10^{12}$, and for the cell array region are $_{49}BF_2^+$, 50 KeV, $6.2 \times 10^{12}$. In this embodiment of the present invention, a preceding ion implantation is carried out for both the peripheral circuit region and the cell array region with the conventional parameters for the peripheral circuit region shown above by utilizing the mask as in FIG. 2A. After that, a subsequent ion implantation is carried out for the cell array region with the compensating parameters of $_{49}BF_2^+$, 50 KeV, $6.0 \times 10^{12}$ by utilizing the mask as in FIG. 2C. Since the energy values for the two regions are the same, the compensating parameters are determined by slightly changing the dose amount.

A sum of doses, applied for the preceding and subsequent ion implantation processes for controlling the threshold voltages, is preferably about 0.95–1.05 times of a dose required for the cell array or peripheral circuit regions where the subsequent ion implantation process for controlling the threshold voltage is implemented when the ion implantation processes for the cell array and peripheral circuit regions are separately implemented.

The compensating parameters were obtained by optimization. However, the present invention is not limited to the optimized compensating parameters.

When implementing the ion implantation process according to the method described above, the manufacturing process can be simplified, and the thus obtained device will exhibit the same or superior characteristics relative to devices obtained by the conventional method.

Figure 4:
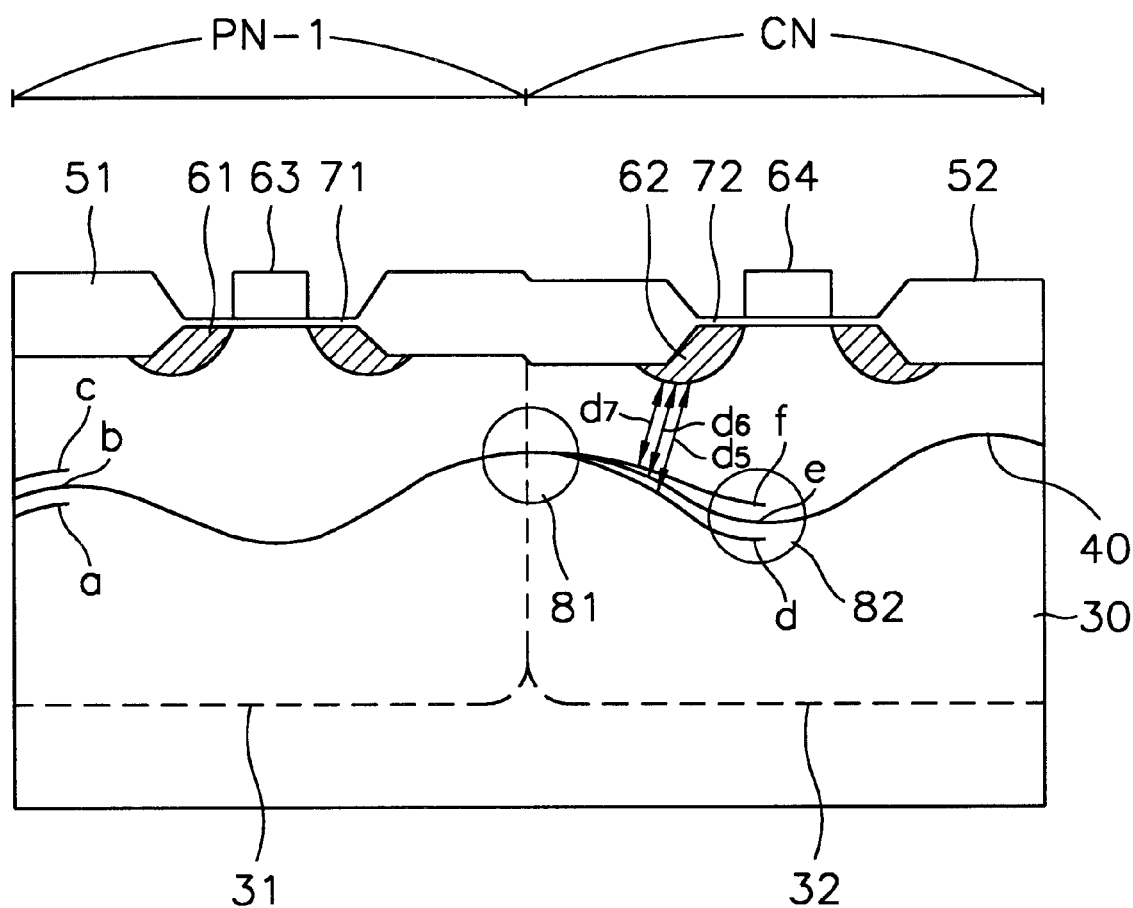
FIG. 4 is a cross-sectional view of a semiconductor device for illustrating a relation between an ion implanting angle and a depth of an ion implanted region according to the present invention.

FIG. 4 is a cross-sectional view of a semiconductor device for illustrating a relation between an ion implanting angle and a depth of an ion implanted region realized by the method of the present invention.

In a device having a small pitch size, a high concentration ion implantation of a portion under a field oxide is required for preventing a deterioration of isolating properties. The above-described field ion implantation is implemented for the isolation in the present invention. The concentration and Rp (projected range) of the ion implantation for a silicon substrate having a lattice structure change according to the ion implantation angle. However, for an oxide, Rp does not change according to the ion implantation angle. Accordingly, the difference of Rp caused by the implantation angle changes a junction characteristic at the junction of an active region and a field region.

ET (electric test) data for the active region and the field region when the ion implantation angles are 7° and 0°, are illustrated in Table 1. The parameters of the ion implantation were $_{11}B^+$, 100 KeV, $7.5 \times 10^{12}$.

TABLE 1

| Implantation angle | Vth | J_BV | C_Iso_BV |
|---|---|---|---|
| 7° | 1.17 | 8.35 | 4.2 |
| 0° | 1.15 | 8.55 | 3.7 |

In Table 1, Vth represents a threshold voltage, J_BV represents a junction breakdown voltage, and C_Iso_BV represents a field oxide breakdown voltage. J_BV and C_Iso_BV show different aspects.

In a MOS device, an electron layer generated by a gate voltage forms a conductive channel between n+ drain and source region. The gate voltage needed for the generation of the conductive channel is referred to as threshold voltage or pinch off voltage.

When excessive reverse voltage is applied to a PN junction diode and the voltage exceeds a predetermined limit voltage, reverse current rapidly increases. This phenomenon is called junction breakdown and the limit voltage is referred to as junction breakdown voltage. If an excessive amount of voltage exceeding the breakdown voltage is applied to a semiconductor device, a damage is imported to the device.

By Table 1, it can be seen that the characteristics are improved at the junction deteriorated at the field region when the ion implantation angle is changed from 7° to 0°.

A good isolation and refresh characteristic can be accomplished by controlling the ion implantation angle in view of a profile change according to the crystal structures of silicon and oxide. That is, if the ion implantation angle is set near 0°, a doping concentration around junction region can be reduced while maintaining constant a doping concentration under the field oxide.

Figure 5:
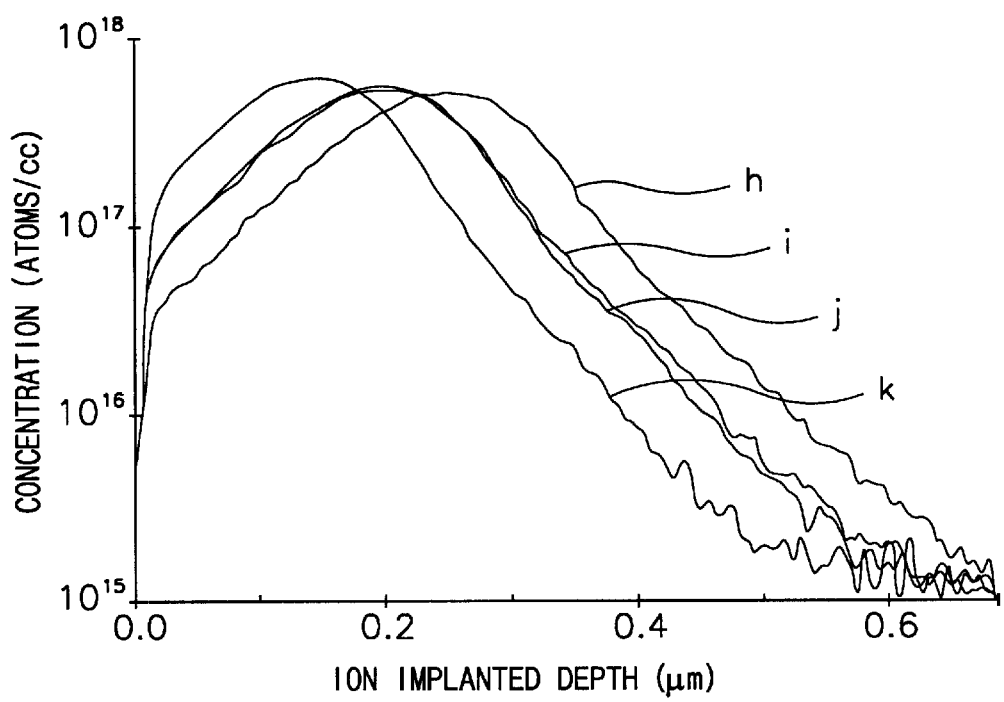
FIG. 5 is a graph for explaining a variation of an ion implanted region according to an applied energy and an ion implanting angle at a field region.
Figure 6:
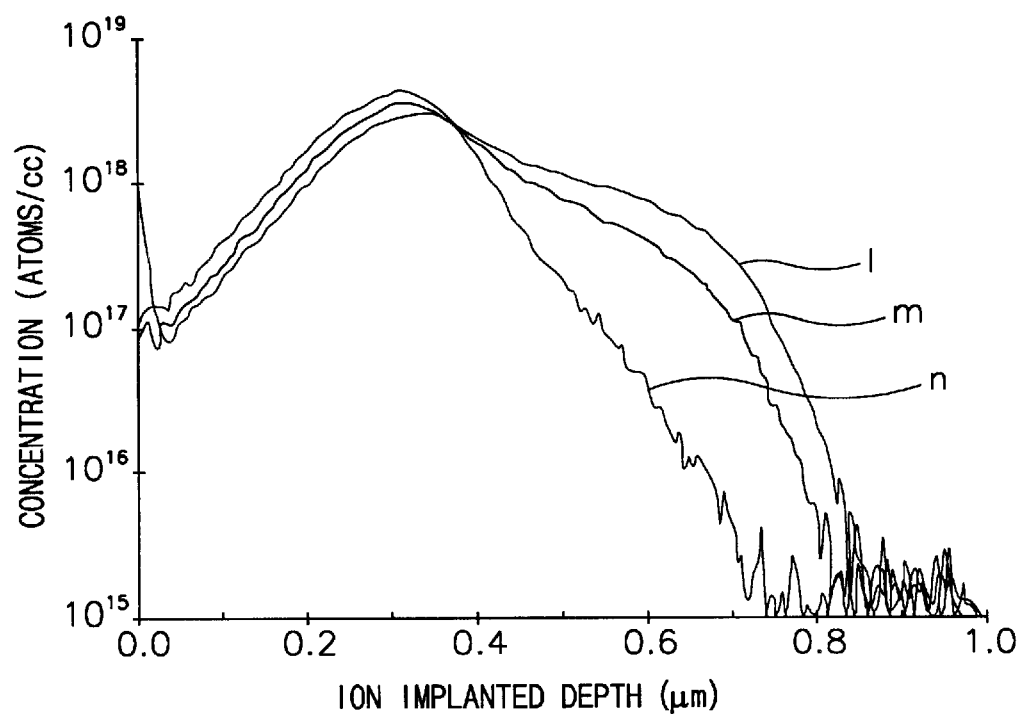
FIG. 6 is a graph for explaining a variation of an ion implanted region according to an ion implanting angle at an active region.

FIG. 5 is a graph for explaining variations of an ion implanted region with respect to an applied energy and an ion implanting angle at a field region, and FIG. 6 is a graph for explaining variations of an ion implanted region with respect to an ion implanting angle at an active region. FIGS. 5 and 6 will be explained with reference to FIG. 4.

Referring to FIG. 5, a field oxide has a thickness of about 1500 Å. Line h represents a doping profile obtained by applying an energy of 120 KeV, a dose of $1.0 \times 10^{13}$ and an ion implantation angle of 7°, line i represents a doping profile obtained by applying an energy of 100 KeV, a dose of $1.0 \times 10^{13}$ and an ion implantation angle of 0°, line j represents a doping profile obtained by applying an energy of 100 KeV, a dose of $1.0 \times 10^{13}$ and an ion implantation angle of 7°, and line k represents a doping profile obtained by applying an energy of 80 KeV, a dose of $1.0 \times 10^{13}$ and an ion implantation angle of 7°.

As the energy gradually decreases from 120 KeV to 100 KeV and 80 KeV, the depth of the ion implanted region from the surface of a substrate gradually decreases to obtain ion implanted lines corresponding to a first, a second and a third ion implanted lines a, b and c illustrated in FIG. 4. On the contrary, when the applied energy values are the same and only the ion implanting angles are different, almost similar ion implanted lines are obtained as illustrated by graphs i and j and by a fifth ion implanted region 81 in FIG. 4.

Referring to FIG. 6, doping profiles can be seen for an active region which has an oxide layer having a thickness of about 103 Å. The applied energy and dose were 100 KeV and $1.0 \times 10^{13}$ and the ion implanted angles were 0° for line l, 1° for line m, and 7° for line n. Referring to FIG. 4, as the ion implanting angle increases from 0° to 1° and 7°, the ion implanted lines become deeper from a fourth implanted line d to a fifth and sixth ion implanted lines e and f at the active region. Distances from each ion implanted region at the active region to source region 61 is $d_5$, $d_6$ and $d_7$.

In conclusion, when other ion implantation parameters are same, better refresh characteristic can be obtained by setting the ion implanting angle near 0°. However, when an ion beam is injected into the same direction of a crystal axis, an energy loss becomes small and the Rp increases. That is, the Rp is dependent on an angle between the ion beam and the crystal axis and an amount of ion dose. To prevent a channeling effect, a wafer is inclined to about 7° with respect to an incident ion beam. Practically, ions are injected with some deviations and the displacement owing to the angle deviation appears less with the angle of 7° than with the angle of 0°. In practice, the angle of 7° is applied when the dose amount is large and the angle of 0° is applied when the dose amount is small.

For the present invention, the angle of 7° is applied in the preceding field ion implantation in which the dose amount is large, while the angle of 0° is applied in the subsequent compensating field ion implantation in which the dose amount is small.

Figure 7:
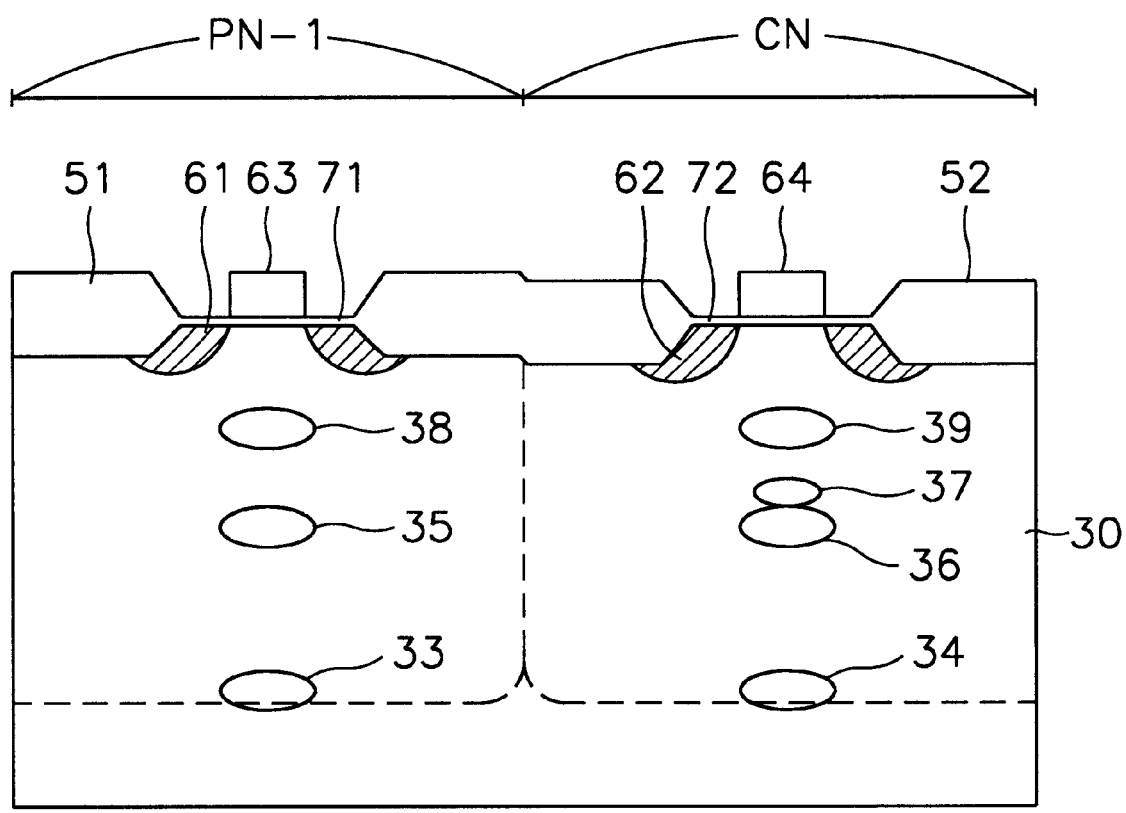
FIG. 7 is a cross-sectional view of a semiconductor device for illustrating ion implanted regions according to an embodiment of the present invention.

FIG. 7 is a cross-sectional view of a semiconductor device for illustrating ion implanted regions according to a preferred embodiment of the present invention.

At NMOS type peripheral circuit region PN-1, a first ion implanted region for forming a well 33, a first field ion implanted region 35, and a first ion implanted region for controlling a threshold voltage 38 are formed from a bottom portion of a substrate 30. At NMOS type cell array region CN, a second ion implanted region for forming a well 34, a second field ion implanted region 36, a compensating field ion implanted region 37, and a second ion implanted region for controlling a threshold voltage 39 are formed. Since the compensating field ion implantation region 37 in the cell array region is formed at the same region of the second ion implanted region for controlling the threshold voltage 39, region 37 is not separately formed. Therefore, the depth of region 39 is the same with that of first ion implantation region for controlling threshold voltage 38. However, $_{11}B^+$ ions and $_{49}BF_2^+$ ions are present at region 39 while only $_{11}B^+$ ions are present at region 38.

The preferred embodiment for manufacturing a device illustrated in FIG. 7 will be explained in more detail below. In this embodiment, a DRAM device having an NMOS type cell array region and a CMOS type peripheral circuit region is illustrated.

First, on a cell array region and a peripheral circuit region for the formation of an NMOS, an n-type silicon substrate was oxidized for a buffer oxidation to a thickness of about 450 Å and silicon nitride was deposited to a thickness of 1600 Å to form an oxide layer and a silicon nitride layer. The silicon nitride layer was etched by utilizing a photoresist pattern and then, photoresist was removed. A field oxidation was implemented by utilizing a nitride pattern at about 900° C. The thickness of the thus obtained field oxide was about 1500 Å at the cell array region and about 2000 Å at the peripheral circuit region.

A photoresist pattern was formed for exposing the NMOS-type peripheral circuit region and the NMOS-type cell array region as illustrated in FIG. 2A. A boron ion implantation was implemented with parameters of $_{11}B^+$, 500 KeV, $1.0\times10^{13}$ to form P-wells at the cell array region and a portion of the peripheral circuit region. After completing the ion implantation, a heat treatment was carried out at about 1000° C. for about 630 minutes under a nitrogen gas flow, and then for 30 minutes under an oxygen gas flow at the same temperature. Then, a field ion implantation process was implemented with parameters of $_{11}B^+$, 110 KeV, $7.2\times10^{12}$ and an ion implantation for controlling the threshold voltage was carried out with parameters of $_{11}B^-$, 50 KeV, $1.0\times10^{12}$.

Thereafter, a photoresist pattern was formed for exposing a PMOS-type peripheral circuit region as illustrated in FIG. 2B. An ion implantation for the formation of a well, a field ion implantation, and an ion implantation for controlling a threshold voltage were continuously carried out.

A photoresist pattern for exposing the cell array region was formed as illustrated in FIG. 2C and a compensating field ion implantation was carried out with parameters of $_{11}B^+$, 90 KeV, $1.5\times10^{12}$. A compensating ion implantation for controlling the threshold voltage was carried out with parameters of $_{49}BF_2^+$, 50 KeV, $6.2\times10^{12}$ by utilizing the same photoresist mask.

Then, a semiconductor device was manufactured by a conventional method. That is, a first oxide layer is formed on an active region of the semiconductor substrate, in which the active region and a field region are separated by the field oxide, by utilizing a thermal oxidation method. Then, a gate electrode is formed as follows. A first conductive layer was formed on the first oxidation layer by depositing a conductive material such as polysilicon doped with impurities, and a second conductive layer is formed by utilizing material such as tungsten-silicide (WSi$_x$). On the second conductive layer, a first dielectric layer of silicon nitride (SiN) is formed. The first dielectric layer functions to protect the second conductive layer during an implementation of subsequent etching and ion implantation processes. Then, a second oxidation layer is formed by using high temperature oxide (HTO). The second oxidation layer is utilized as an etching stopper during an etching process for forming a spacer.

A photoresist pattern is then formed on the second oxidation layer and a gate electrode is obtained by continuously and anisotropically etching the second oxidation layer, the first dielectric layer, the second conductive layer, the first conductive layer and the first oxidation layer.

An n-type impurity is doped onto the exposed active region of the semiconductor substrate to form a source/drain diffusion region of a transistor. During the ion doping, the gate electrode acted as a mask.

On the substrate in which the gate electrode is formed, dielectric material such as BPSG (borophosphosilicate glass) is deposited to form a dielectric interlayer. Then, a photoresist pattern was formed on the dielectric interlayer and an exposed portion is etched to form a contact hole. Metal is then deposited to form a contact and wiring layer to manufacture a semiconductor device according to the method of the present invention.

The above-described method of the present invention can be applied for the formation of ion implanted regions for a PMOS-type cell array region and a PMOS-type peripheral circuit region.

In addition, a LOCOS (local oxidation of silicon) method was applied for the isolation of the elements in the preferred embodiment of the present invention. However, the present invention can be applied to a device utilizing an STI (shallow trench isolation) method. Particularly, because the depth of the trench at the peripheral circuit region and at the cell array region are almost the same, the parameters of field ion implantations for the two regions are almost the same.

When the field ion implantation parameters are similar but somewhat different for the two regions, the above-described method of the present invention can be applied and when the field ion implantation parameters are same, the compensating field ion implantation for the cell array region can be omitted.

According to the method of the present invention, separately implemented ion implantation processes for the peripheral circuit region and the cell array region can be carried out in a closely connected manner, and therefore, the number of steps of the ion implantation process can be reduced to simplify the manufacturing of the semiconductor, thereby improving the productivity of the devices. In addition, since moderate ion implantation parameters accompany the subsequent compensating process, an ion implantation angle of 0° can be applied for the compensating ion implantation. Thus, a semiconductor device having improved properties can be realized.

While the present invention is described in detail referring to the attached embodiment, various modifications, alternate constructions and equivalents may be employed without departing from the true spirit and scope of the present invention.

What is claimed is:

1. A method of manufacturing a semiconductor device, said method comprising:

forming a first mask which exposes a cell array region and a peripheral circuit region of a semiconductor substrate, the cell array region and the peripheral circuit region having a same conductive MOS type;

implementing a preceding ion implantation process in both the cell array region and the peripheral circuit region utilizing said first mask, the preceding ion implantation process having ion implantation parameters corresponding to first implantation design specifications of one of said cell array region and said peripheral circuit region;

forming a second mask which shields said one of said cell array region and said peripheral circuit region and which exposes the other of said cell array region and said peripheral circuit region; and implementing a subsequent ion implantation process in said other of said cell array region and said peripheral circuit region utilizing said second mask, said subsequent ion implantation process having ion implantation parameters which compensate for a difference between the ion implantation parameters of said preceding implantation process and second implantation design specifications of said other of said cell array region and said peripheral circuit region.

2. A method of manufacturing a semiconductor device as claimed in claim 1, wherein said first implantation design specifications are for said peripheral region, and wherein said preceding ion implantation process includes a well forming ion implantation process, a field ion implantation process, and an ion implantation process for controlling a threshold voltage.

3. A method of manufacturing a semiconductor device as claimed in claim 2, wherein said subsequent ion implantation process includes compensation of said field ion implantation process and said ion implantation process for controlling a threshold voltage.

4. A method of manufacturing a semiconductor device as claimed in claim 3, wherein an energy value of said subsequent ion implantation process for compensation of said field ion implantation process is about 0.7 to 1 times an energy value needed to achieve said second implantation design specifications in the absence of said preceding ion implantation process.

5. A method of manufacturing a semiconductor device as claimed in claim 4, wherein an energy value of said subsequent ion implantation process for compensation of said field ion implantation process is about 0.85 to 1 times an energy value needed to achieve said second implantation design specifications in the absence of said preceding ion implantation process.

6. A method of manufacturing a semiconductor device as claimed in claim 3, wherein a sum of doses applied of said preceding and subsequent ion implantation processes for said field ion implantation is about 1 to 1.3 times a dose needed to achieve said second implantation design specifications in the absence of said preceding ion implantation process.

7. A method of manufacturing a semiconductor device as claimed in claim 3, wherein a sum of doses of said preceding and subsequent ion implantation processes for controlling said threshold is about 0.95 to 1.05 times a dose needed to achieve said second implantation design specifications in the absence of said preceding ion implantation process.

8. A method of manufacturing a semiconductor device as claimed in claim 1, wherein an ion implantation angle of said preceding ion implantation is about 7° from normal.

9. A method of manufacturing a semiconductor device as claimed in claim 1, wherein an ion implantation angle of said subsequent ion implantation is about 0° from normal.

10. A method of manufacturing a semiconductor device as claimed in claim 1, further comprising isolating each element of said semiconductor device using a LOCOS (local oxidation of silicon) process or a shallow trench isolation (STI) process.

11. A method of manufacturing a semiconductor device as claimed in claim 1, further comprising isolating each element of said semiconductor device using a shallow trench isolation (STI) process, wherein said subsequent ion implantation process is an ion implantation process for controlling a threshold voltage.

12. A method of manufacturing a semiconductor device, said method comprising:

forming a first mask which exposes a cell array region and a peripheral circuit region of a semiconductor substrate, the cell array region and the peripheral circuit region each being of a same conductive MOS type;

conducting a first ion implantation for forming a well, a second ion implantation for forming a field, and a third ion implantation for controlling a threshold voltage in both said cell array region and said peripheral circuit region utilizing said first mask, wherein ion implantation parameters of said first, second and third ion implantations correspond to implantation design specifications of said peripheral circuit region and include an implantation angle of about 7° from normal;

forming a second mask which shields said peripheral circuit region and which exposes said cell array region; and conducting a fourth ion implantation for forming a field and a fifth ion implantation for controlling a threshold voltage in said cell array region utilizing said second mask, wherein ion implantation parameters of said fourth and fifth ion implantations compensate for a difference between the ion implantation parameters of said second and third implantation processes and implantation design specifications of said cell array region and include an implantation angle of about 0° from normal.

13. A method of manufacturing a semiconductor device as claimed in claim 12, wherein said conductive MOS type is an NMOS type.

14. A method of manufacturing a semiconductor device as claimed in claim 12, wherein said conductive MOS type is a PMOS type.

15. A method of manufacturing a semiconductor device, said method comprising:

provicing a substrate comprising a cell array region, a first peripheral circuit region, and a second peripheral circuit region;

masking the second peripheral circuit region, and subjecting the cell array region and the first peripheral circuit region to first ion implantation processes, wherein parameters of the first ion implantation processes are set to achieve first design implantation specifications in the first peripheral circuit region;

masking the cell array region and the first peripheral circuit region, and subjecting the second peripheral circuit region to at least one second ion implantation process, wherein parameters of the second ion implantation process are set to achieve second design implantation specifications in the second peripheral circuit region; and masking the first peripheral circuit region and the second peripheral circuit region, and subjecting the cell array region to at least one third ion implantation process, wherein parameters of the third ion implantation process is set to compensate for a difference between third design implantation specifications in the cell array region and the first design implantation specifications in the first peripheral circuit region.

16. The method of manufacturing a semiconductor device as claimed in claim 15, wherein the cell array region and the first peripheral circuit region are PMOS regions, and the second peripheral circuit region is an NMOS region.

17. The method of manufacturing a semiconductor device as claimed in claim 16, wherein the first ion implantation processes include an N-well formation process for forming N-wells in the cell array region and in the first peripheral circuit region, and wherein the third ion implantation process does not compensate for implantation specifications of the N-well formed in the cell array region by the N-well formation process of the first ion implantation processes.

18. The method of manufacturing a semiconductor device as claimed in claim 17, wherein the first ion implantation processes further include a field ion implantation process and a threshold voltage adjustment ion implantation process, and wherein the third ion implantation process compensates for implantation specifications in the cell array region formed by the field ion implantation process and the threshold voltage adjustment ion implantation process of the first ion implantation processes.

19. The method of manufacturing a semiconductor device as claimed in claim 15, wherein the cell array region and the first peripheral circuit region are NMOS regions, and the second peripheral circuit region is a PMOS region.

20. The method of manufacturing a semiconductor device as claimed in claim 19, wherein the first ion implantation processes include a P-well formation process for forming P-wells in the cell array region and in the first peripheral circuit region, and wherein the third ion implantation process does not compensate for implantation specifications of the P-well formed in the cell array region by the P-well formation process of the first ion implantation processes.

21. The method of manufacturing a semiconductor device as claimed in claim 20, wherein the first ion implantation processes further include a field ion implantation process and a threshold voltage adjustment ion implantation process, and wherein the third ion implantation process compensates for implantation specifications in the cell array region formed by the field ion implantation process and the threshold voltage adjustment ion implantation process of the first ion implantation processes.

* * * * *